United States Patent
Tsutsumi et al.

(10) Patent No.: US 7,884,527 B2
(45) Date of Patent: Feb. 8, 2011

(54) PIEZOELECTRIC THIN-FILM RESONATOR AND FILTER USING THE SAME

(75) Inventors: Jun Tsutsumi, Kawasaki (JP); Tsuyoshi Yokoyama, Kawasaki (JP); Takeshi Sakashita, Kawasaki (JP); Shinji Taniguchi, Kawasaki (JP); Masafumi Iwaki, Kawasaki (JP); Tokihiro Nishihara, Kawasaki (JP); Masanori Ueda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/259,347

(22) Filed: Oct. 27, 2005

(65) Prior Publication Data

US 2006/0091764 A1   May 4, 2006

(30) Foreign Application Priority Data

Oct. 28, 2004   (JP)   ............................ 2004-313727

(51) Int. Cl.
  *H01L 41/047* (2006.01)
(52) U.S. Cl. ...................................... 310/320; 310/365
(58) Field of Classification Search ................. 310/320, 310/365, 324
  See application file for complete search history.

(56) References Cited

U.S. PATENT DOCUMENTS

| | | | |
|---|---|---|---|
| 3,382,381 A | 5/1968 | Horton | |
| 5,504,388 A * | 4/1996 | Kimura et al. | 310/363 |
| 6,150,703 A | 11/2000 | Cushman et al. | |
| 6,381,820 B1 | 5/2002 | Cushman et al. | |
| 6,469,597 B2 * | 10/2002 | Ruby et al. | 333/187 |
| 6,657,363 B1 | 12/2003 | Aigner | |
| 6,914,368 B2 * | 7/2005 | Nakamura et al. | 310/365 |
| 7,140,084 B2 * | 11/2006 | Yamada et al. | 29/25.35 |
| 7,180,390 B2 * | 2/2007 | Umeda et al. | 333/187 |
| 2002/0190814 A1 | 12/2002 | Yamada et al. | |
| 2003/0058065 A1 * | 3/2003 | Abe et al. | 333/188 |
| 2004/0021529 A1 * | 2/2004 | Bradley et al. | 333/187 |
| 2004/0027030 A1 * | 2/2004 | Wang et al. | 310/311 |

(Continued)

FOREIGN PATENT DOCUMENTS

EP   0 973 256 A1   1/2000

(Continued)

OTHER PUBLICATIONS

K.M. Lakin et al; Development of Miniature Filters for Wireless Applications; *TFR Technologies, Inc.*; pp. 883-886.

(Continued)

*Primary Examiner*—Quyen P Leung
*Assistant Examiner*—Derek J Rosenau
(74) *Attorney, Agent, or Firm*—Arent Fox LLP

(57) ABSTRACT

A piezoelectric thin-film resonator includes: a substrate; a lower electrode that is formed on the substrate; a piezoelectric film that is formed on the lower electrode and the substrate; and an upper electrode that is formed on the piezoelectric film, with the piezoelectric film being partially interposed between the lower electrode and the upper electrode facing each other. In this piezoelectric thin-film resonator, at least a part of the outer periphery of the piezoelectric film interposed between the lower electrode and the upper electrode overlaps the outer periphery of the region formed by the upper electrode and the lower electrode facing each other.

11 Claims, 14 Drawing Sheets

U.S. PATENT DOCUMENTS

| | | |
|---|---|---|
| 2004/0027214 A1 | 2/2004 | Duwel et al. |
| 2005/0006984 A1* | 1/2005 | Komuro et al. ............. 310/324 |
| 2005/0140466 A1* | 6/2005 | Larson et al. ............... 333/187 |

FOREIGN PATENT DOCUMENTS

| | | |
|---|---|---|
| EP | 1 041 717 A2 | 10/2000 |
| EP | 1 126 601 A2 | 8/2001 |
| EP | 1 217 734 A2 | 6/2002 |
| EP | 1 406 383 A2 | 4/2004 |
| EP | 1 533 896 A2 | 5/2005 |
| JP | 60-149215 A | 8/1985 |
| JP | 60-149215 A | 8/1985 |
| JP | 2-113616 | 4/1990 |
| JP | 9-64675 A | 3/1997 |
| JP | 2000-031552 A | 1/2000 |
| JP | 2002-372974 A | 12/2002 |
| JP | 2003-133892 A | 5/2003 |
| JP | 2004-120494 A | 4/2004 |
| JP | 2004104449 | 4/2004 |
| WO | WO-99/37023 A1 | 7/1999 |
| WO | WO 01/06647 A1 | 1/2001 |

OTHER PUBLICATIONS

Pang Wei et al; High Q Film Bulk Acoustic Resonator From 2.4 to 5.1GHZ; *Department of Electrical Engineering-Electrophysics*; University of Southern California; pp. 805-808.

Robert Aigner et al; Bulk-Acoustic-Wave Filters: Performance Optimization and Volume Manufacturing; pp. 2001-2004.

European Search Report dated May 31, 2007.

IEEE Ultrasonics Symposium, pp. 84-87, J. Kaitila et al. "Spurious Resonance Free Bulk Acoustic Wave Resonators", 2003.

* cited by examiner

PIEZOELECTRIC THIN-FILM RESONATOR AND FILTER USING THE SAME

BACKGROUND OF THE INVENTION

1. Field of the Invention

The present invention generally relates to a piezoelectric thin-film resonator, and more particularly, to a filter using the piezoelectric thin-film resonator.

2. Description of the Related Art

As wireless communication devices such as mobile-phone handsets have widely spread, there is an increasing demand for filters and duplexers with higher performance. Filters and duplexers using piezoelectric thin-film resonators have characteristics with low loss and high power resistance, and therefore, are drawing attention as next-generation filters and duplexers to replace surface acoustic wave filters. The reason that each piezoelectric thin-film resonator filter causes low loss and exhibits high power resistance lies in the simple structure of each resonator. With the resonators having simple structures, electrodes of reasonable size can be maintained at higher frequencies, and deterioration in performance due to an increase of electric resistance can be avoided. However, the characteristics of surface acoustic wave filters have dramatically improved recently. To compete with them, it is necessary to develop piezoelectric thin-film resonator filters with higher performance and lower loss. In this trend, development to produce piezoelectric thin-film resonators that cause lower loss is being actively promoted.

Piezoelectric thin-film resonators of this type are generally known as FBAR (film bulk acoustic resonators), and are disclosed in Japanese Unexamined Patent Publication Nos. 2004-120494 and 2002-372974, and U.S. Pat. No. 6,657,363, for example.

One of the reasons of the loss caused in a piezoelectric thin-film resonator filter is that surface acoustic waves leak to the outside of the region formed by the upper electrode and the lower electrode facing each other (the region being referred to as the "resonator portion", the outside region being referred to as the "non-resonator portion"). Surface acoustic waves cannot be re-converted into electric signals at the non-resonator portion, and result in low. This is referred to as "horizontal leakage". The cause of the horizontal leakage lies in the sound velocity ratio between the resonator portion and the non-resonator portion. Such a sound velocity ratio as to prevent the horizontal leakage is determined by the Poisson's ratio of the piezoelectric film employed in the filter. If the Poisson's ratio is higher than 1/3, the sound velocity of the resonator portion is lower than the sound velocity of the non-resonator portion. If the Poisson's ratio is lower than 1/3, the sound velocity of the resonator portion is higher than the sound velocity of the non-resonator portion. With a piezoelectric film having a Poisson's ratio of 1/3 or higher, the sound velocity of the resonator portion can be made lower than the sound velocity of the surrounding region by performing mass addition on the resonator portion. In this manner, the horizontal leakage can be prevented easily.

However, if the Poisson's ratio of the piezoelectric film is lower than 1/3, the relationship in the sound velocity is reversed, and the horizontal leakage cannot be easily prevented. In each piezoelectric thin-film filter that is currently used in practice, AlN with a Poisson's ratio lower than 1/3 is employed as the piezoelectric film. Because of this, it is difficult to prevent the horizontal leakage, and the loss becomes even larger.

SUMMARY OF THE INVENTION

It is therefore an object of the present invention to provide a piezoelectric thin-film resonator and a filter in which the above disadvantage is eliminated.

A more specific object of the present invention is to provide a piezoelectric thin-film filter that can prevent the horizontal leakage and causes low loss, so as to satisfy the requirements for piezoelectric thin-film filters.

According to an aspect of the present invention, there is provided a piezoelectric thin-film resonator including: a substrate; a lower electrode that is formed on the substrate; a piezoelectric film that is formed on the lower electrode and the substrate; and an upper electrode that is formed on the piezoelectric film, with the piezoelectric film being partially interposed between the lower electrode and the upper electrode facing each other, at least a part of the outer periphery of the piezoelectric film interposed between the lower electrode and the upper electrode overlapping the outer periphery of the region formed by the upper electrode and the lower electrode facing each other.

According to another aspect of the present invention, there is provided a piezoelectric thin-film resonator comprising: a substrate; a lower electrode that is formed on the substrate; a piezoelectric film that is formed on the lower electrode and the substrate; and an upper electrode that is formed on the piezoelectric film, with the piezoelectric film being partially interposed between the lower electrode and the upper electrode facing each other, the piezoelectric film being made of a material having a Poisson's ratio of 1/3 or lower, an additional film being formed on an extraction portion of the upper electrode, the additional film being located in the vicinity of the portion interposed between the upper electrode and the lower electrode facing each other.

According to a further aspect of the present invention, there is provided a filter including any of the above-mentioned piezoelectric thin-film resonators.

The present invention can provide a piezoelectric thin-film resonator that can prevent the horizontal leakage and reduce the loss, and a piezoelectric thin-film resonator filter with low loss.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
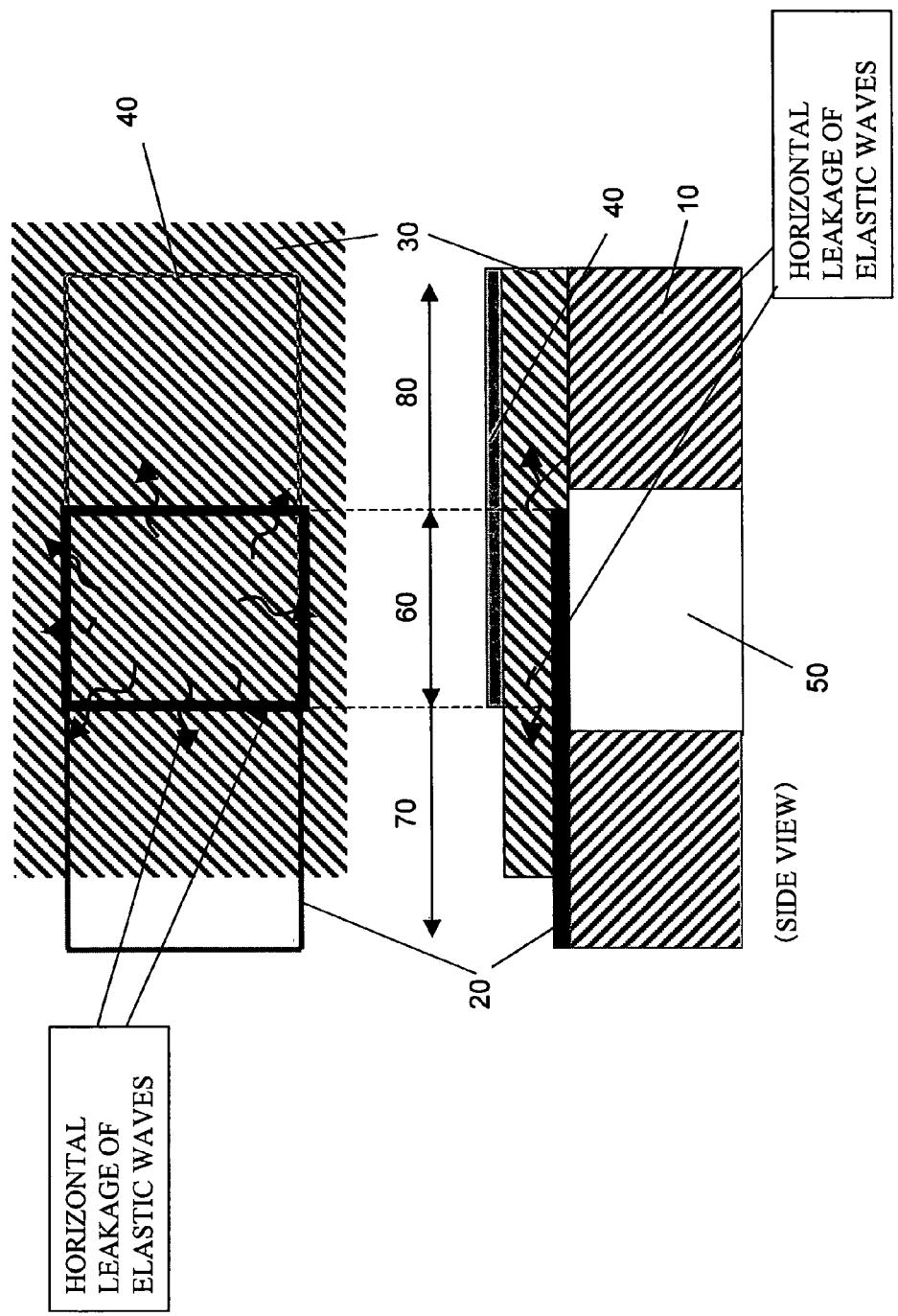
FIG. 1 illustrates the fundamental structure of a conventional piezoelectric thin-film resonator.

Referring first to FIG. 1, the fundamental structure of a piezoelectric thin-film resonator is described. The most typical shape of a resonator is a square shape. In FIG. 1, the piezoelectric thin-film resonator includes: a substrate 10; a lower electrode 20 that is formed under the substrate 10; a piezoelectric film 30 that is formed on the lower electrode 20 and the substrate 10; and an upper electrode 40 that is formed on the piezoelectric film 30 and partially sandwiches the piezoelectric film 30 with part of the lower electrode 20. The region interposed between the upper electrode 40 and the lower electrode 20 is a resonator portion 60. The oscillation generated in the resonator portion 60 is thickness longitudinal vibration. The substrate 10 is located under the region, and has a void 50 that is wider than the region. The void 50 may be an acoustic multi-layer film, but will be described as a void in the following description. The piezoelectric thin-film resonator further includes non-resonator portions 70 and 80. Although an end of the lower electrode 40 is located inside the void 50 in FIG. 1, it may overlap an end of the void 50. Likewise, although an end of the upper electrode 40 is located inside the void 50, it may overlap an end of the void 50. This aspect of the embodiment is also observed in the other embodiments of the present invention described below.

In this fundamental structure, if the relationship in terms of sound velocity between the resonator portion 60 and the non-resonator portions 70 and 80 is set so as to cause horizontal leakage, surface acoustic waves leak to the non-resonator portions 70 and 80 from the resonator portion 60 via the piezoelectric film 30, as indicated by the arrows in FIG. 1. In the present invention, the horizontal leakage caused via the piezoelectric film is to be reduced by changing the structure of the piezoelectric thin-film resonator in the manner illustrated in FIG. 2.

More specifically, the part of the piezoelectric film 30 located above the non-resonator region 70 is removed by patterning the piezoelectric film 30, so that the patterned outer periphery of the piezoelectric film 30 overlap at least part of the outer peripheral of the resonator portion 60. By doing so, the region from which the piezoelectric film 30 has been removed does not have a medium to transmit surface acoustic waves. Accordingly, the horizontal leakage does not occur. Since the piezoelectric film 30 still covers the entire resonator portion 60, the efficiency of re-converting the mechanical vibration to electric signals does not decrease, and the loss can be reduced.

Figure 2:
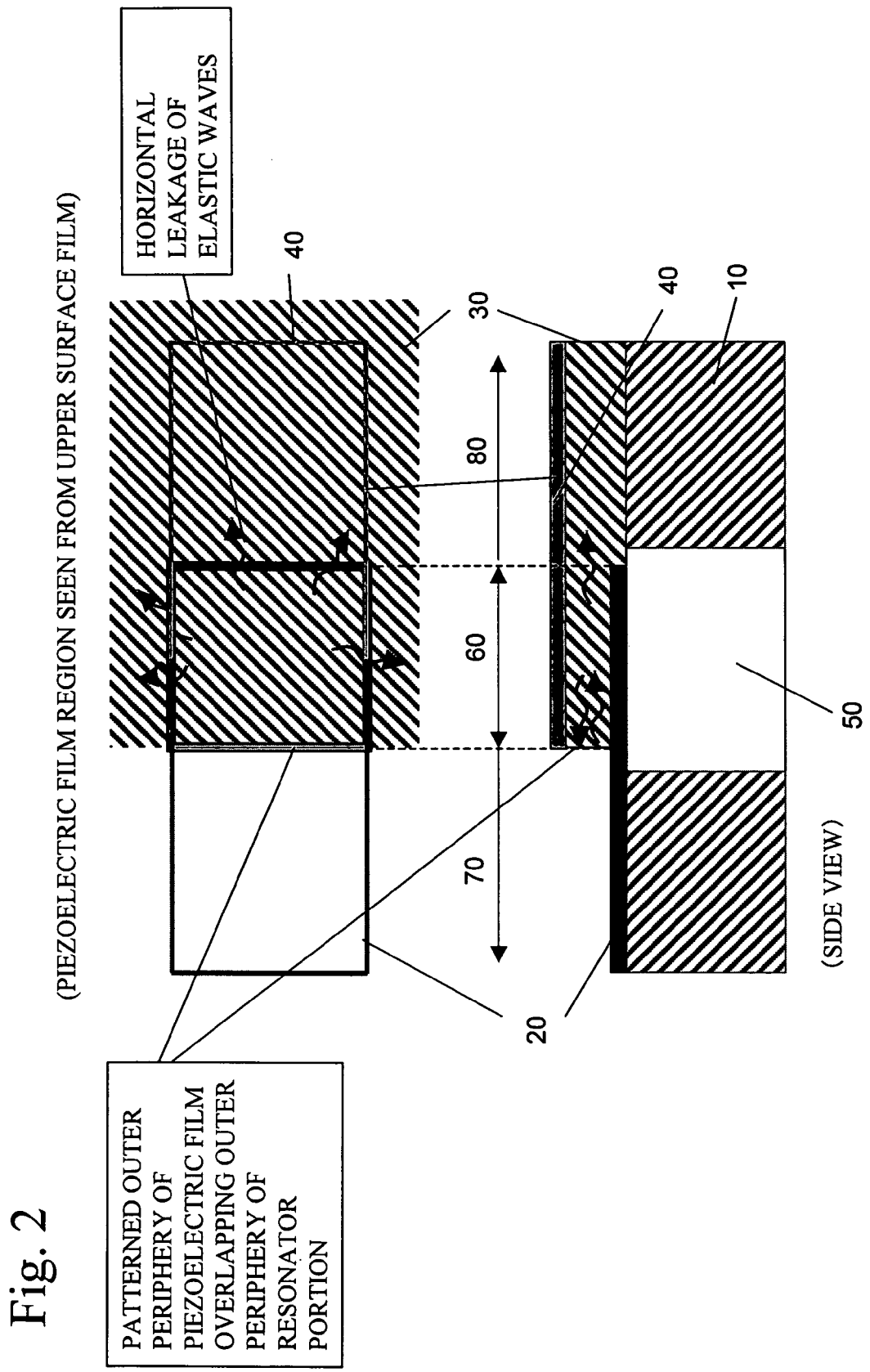
FIG. 2 illustrates an embodiment of the present invention.
Figure 3:
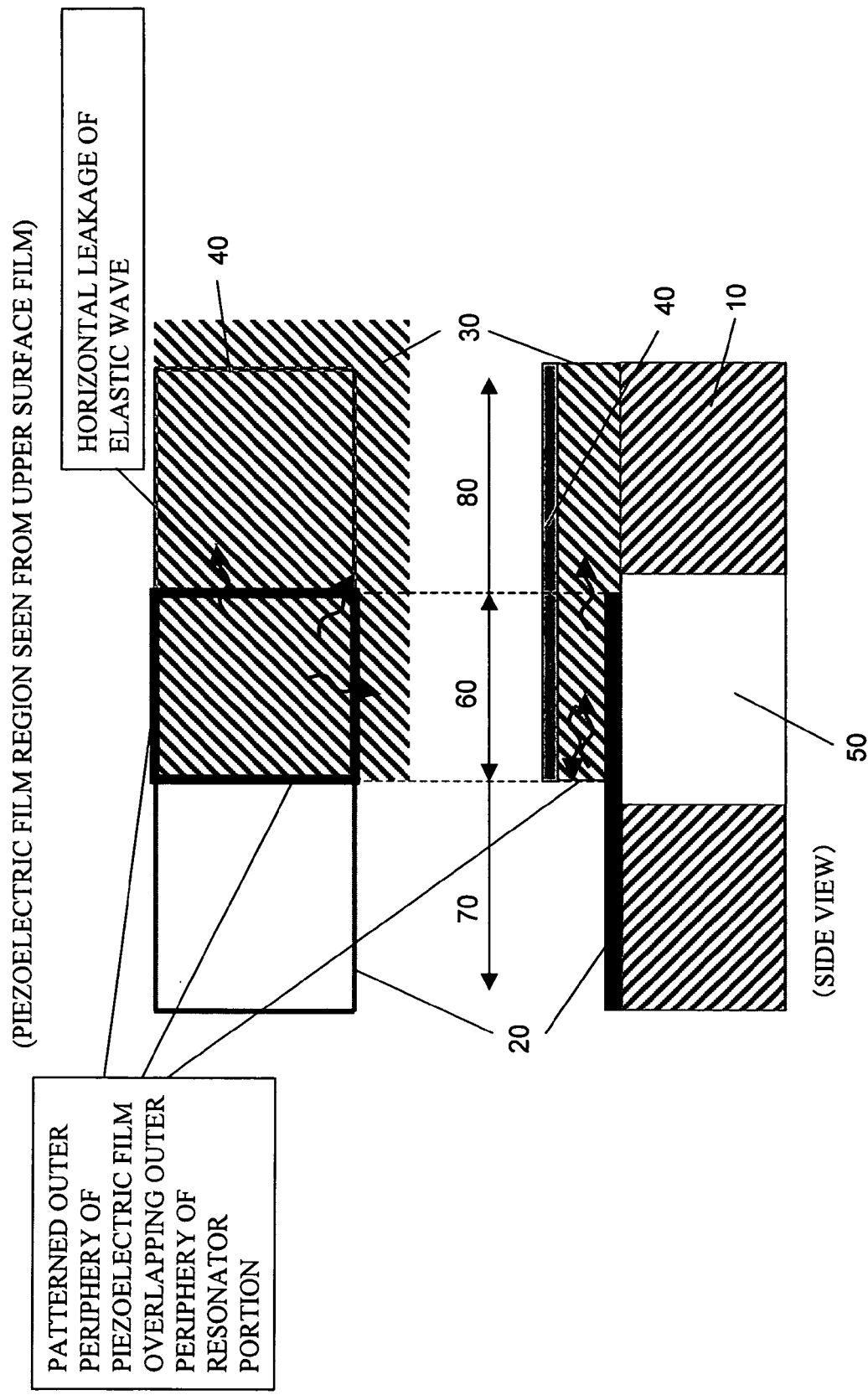
FIG. 3 illustrates a modification of the embodiment illustrated in FIG. 2.

Next, the region from which the piezoelectric film is removed in a non-resonator portion is described. According to the principles, the more the piezoelectric film 30 is removed from the non-resonator portion 70, the smaller the horizontal leakage becomes. Accordingly, the piezoelectric film 30 should preferably be removed from the non-resonator portion 70 as much as possible. The structure illustrated in FIG. 2 is the simplest structure in which only one side of the square resonator portion 60 overlaps the outer periphery of the piezoelectric film 30. Here, 25% of the outer periphery of the piezoelectric film 30 overlaps the outer periphery of the resonator portion 60. When the piezoelectric film 30 is etched, the rate of etching the part of the piezoelectric film 30 located on the lower electrode 20 is not equal to the rate of etching the part of the piezoelectric film 30 located on the substrate 10. Therefore, it is necessary to add an extra step to the production procedures to perform etching on both parts. The simplest possible structure for the piezoelectric thin-film resonator is the structure in which only one side of the resonator portion 60 overlaps the outer periphery of the piezoelectric film 30 as shown in FIG. 2. Through improvements of the production procedures, it is of course possible to achieve further improvements of characteristics by etching the parts of the piezoelectric film 30 on the lower electrode 20 and the substrate 10 so that more than 25% of the outer periphery of the resonator portion 60 overlaps the outer periphery of the piezoelectric film 30. For example, it is preferable to design the structure so that two sides of the resonator portion 60 overlap the outer periphery of the piezoelectric film 30, as shown in FIG. 3.

Figure 4:
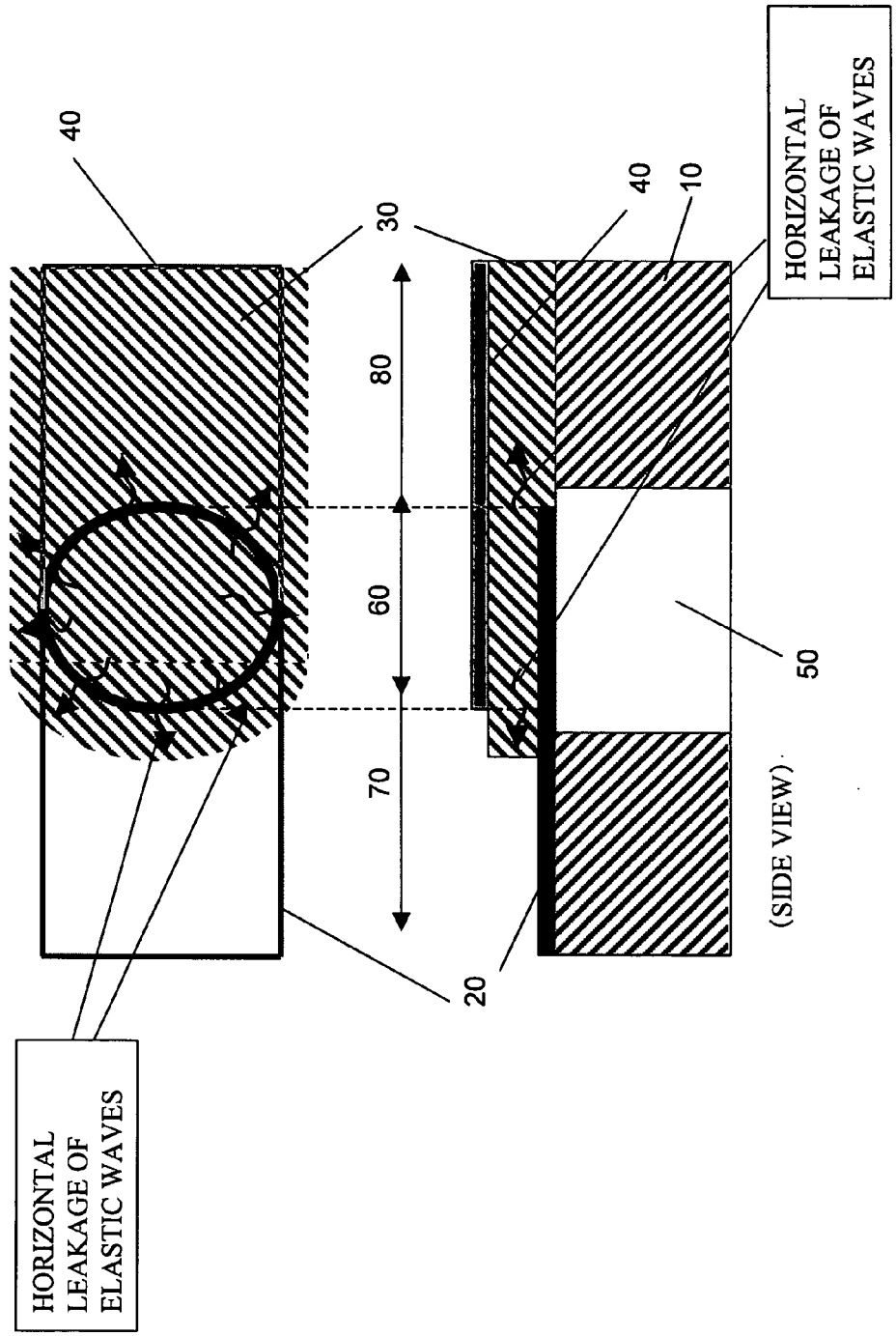
FIG. 4 illustrates another example structure of a conventional piezoelectric thin-film resonator.
Figure 5:
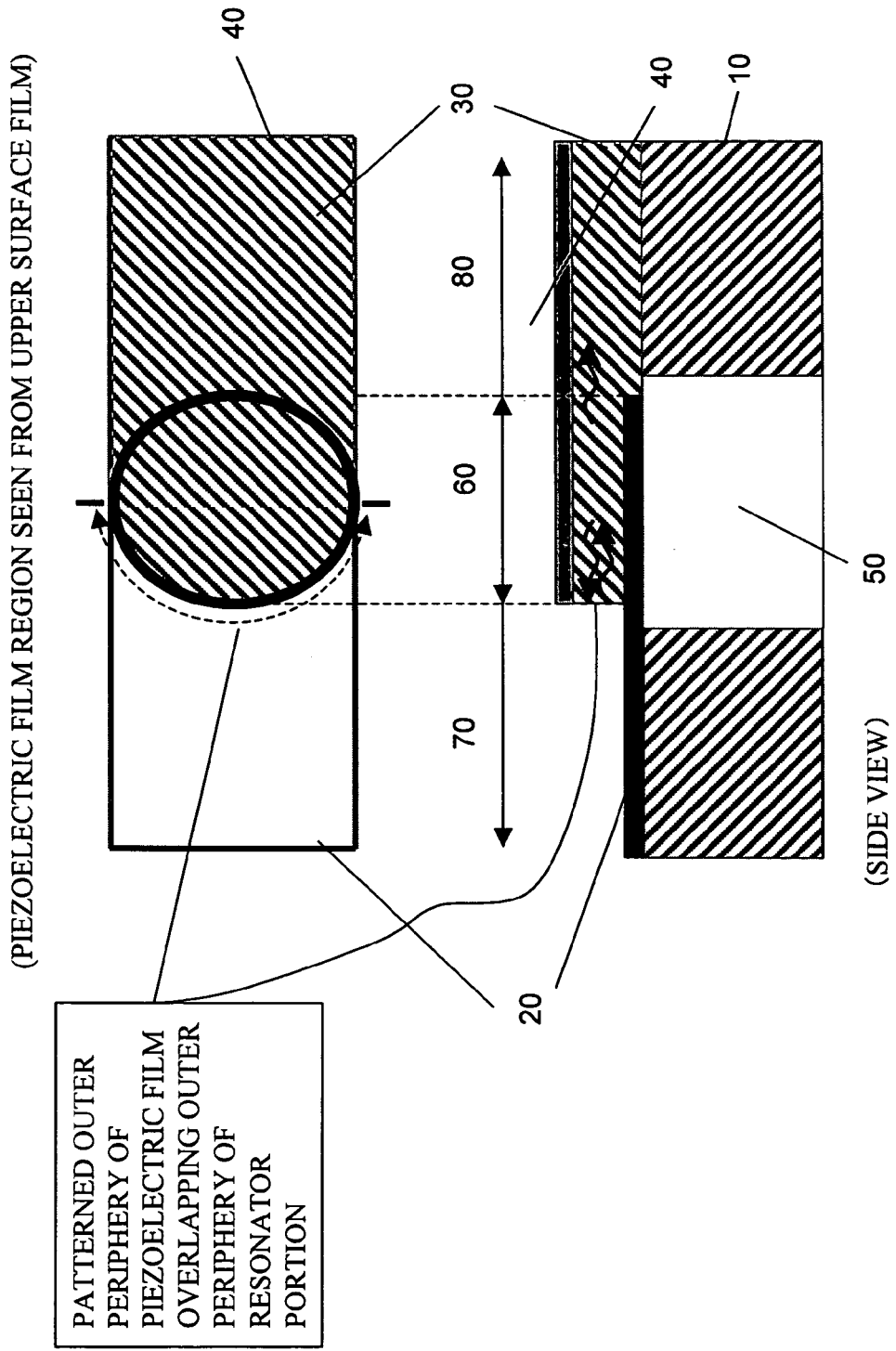
FIG. 5 illustrates another modification of the embodiment illustrated in FIG. 2.
Figure 6:
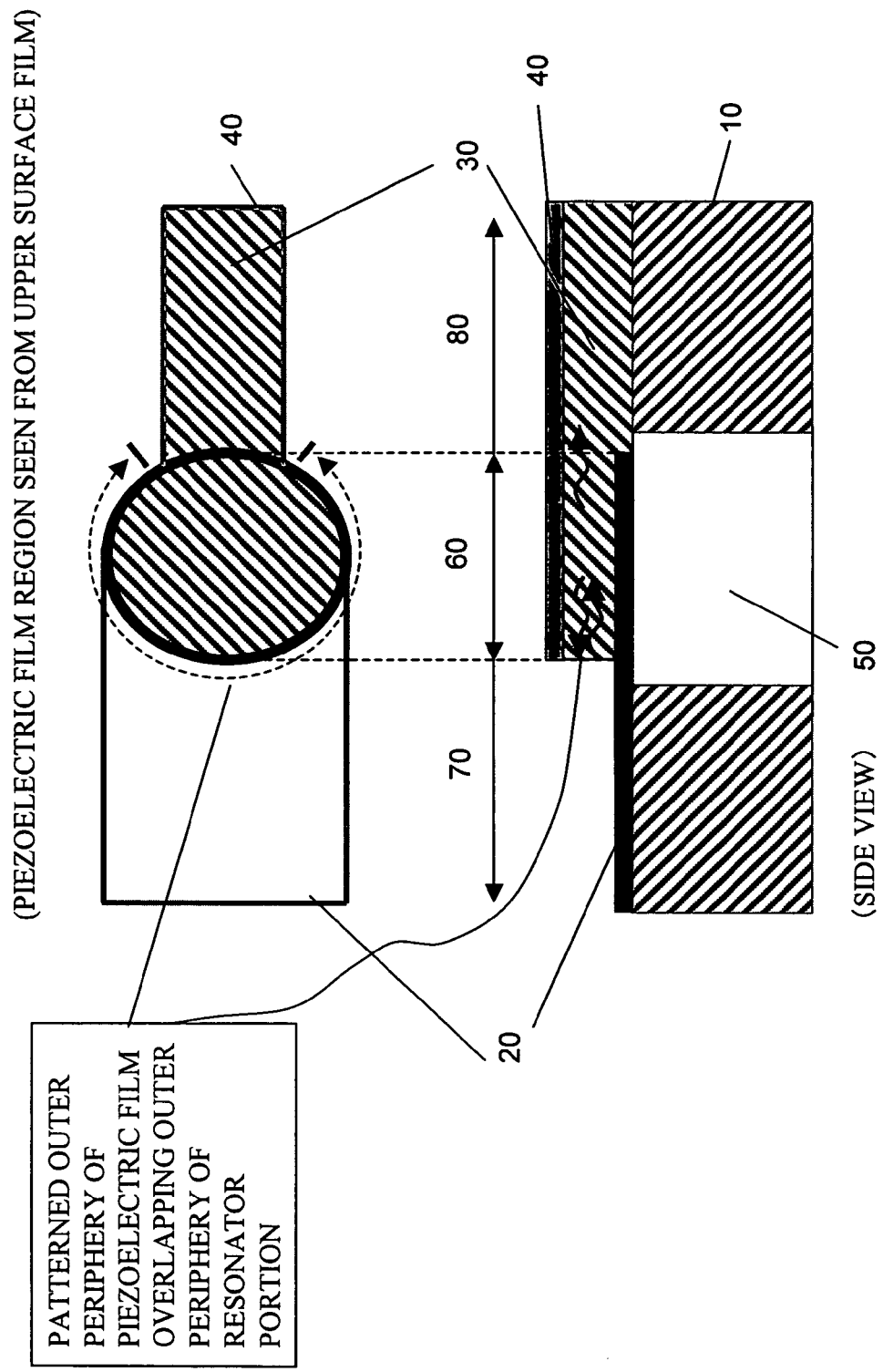
FIG. 6 illustrates yet another modification of the embodiment illustrated in FIG. 2.

Referring now to FIG. 4, a piezoelectric thin-film resonator having an oval-type resonator portion 60 is described. As in the case where the resonator portion 60 has a square shape, horizontal leakage is caused through the piezoelectric film 30. After the piezoelectric film 30 is partially removed, the resultant structure is as simple as the structure illustrated in FIG. 5. If the lower electrode 20 has substantially the same shape as an extraction portion 42 of the upper electrode 40, the pattern outer periphery of the piezoelectric film 30 overlaps the outer periphery of the resonator portion 60 by approximately 50%. In other words, 50% of the structure can be readily produced. Here, the production procedures can be optimized by making the width 42 of the extraction portion 42 of the upper electrode 40 shorter than the length of the longitudinal axis of the resonator portion 60, as illustrated in FIG. 6. Accordingly, after the parts of the piezoelectric film 30 on the lower electrode 20 and the substrate 10 are etched, 50% or more of the pattern outer periphery of the piezoelectric film 30 can overlap the outer periphery of the resonator portion 60. Thus, almost all the horizontal leakage can be restricted, and the loss can be further reduced.

Figure 7:
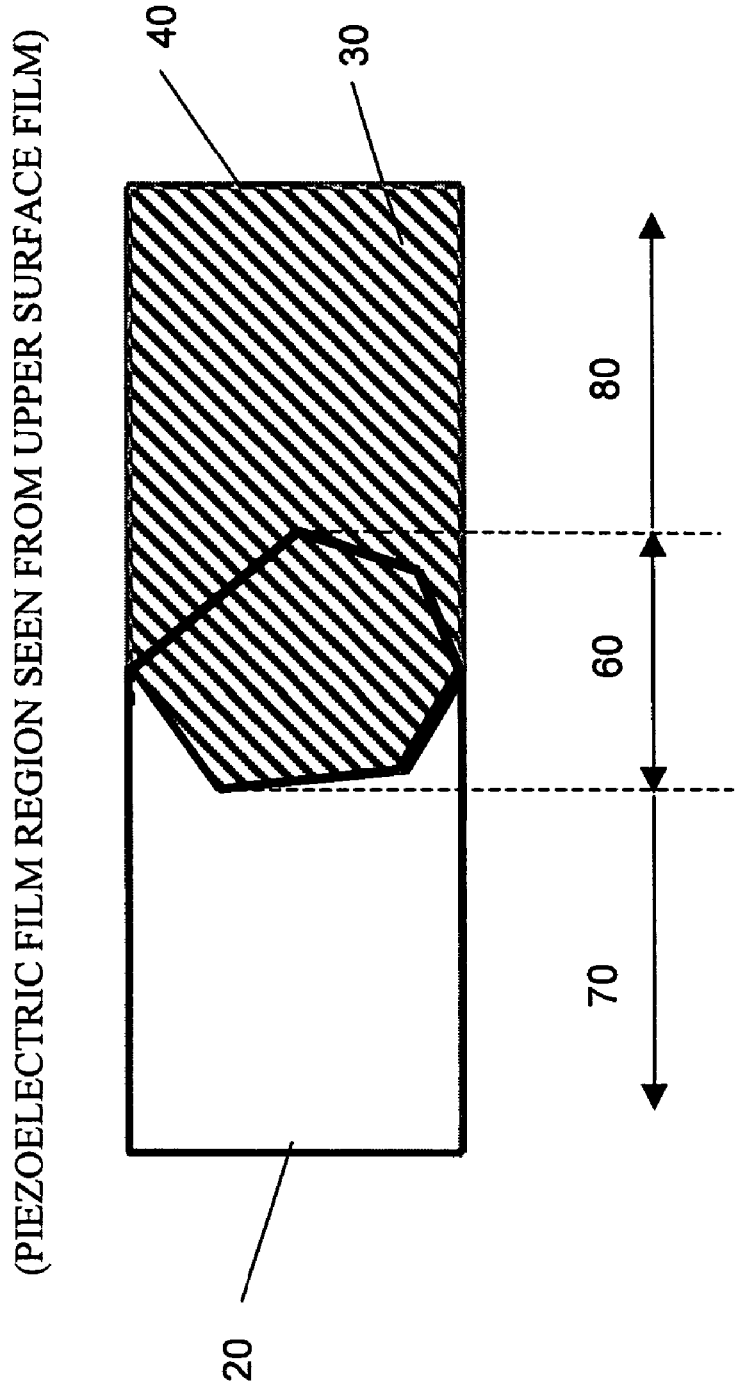
FIG. 7 illustrates still another modification of the embodiment illustrated in FIG. 2.

Next, the elastic waves reflected from the edge of the patterned piezoelectric film are described. Most elastic waves are reflected at the edge of the patterned piezoelectric film. Further, the reflected elastic waves are locked in the resonator portion, because horizontal leakage is not caused. If the reflected waves exist as horizontal standing waves in the resonator portion, ripples are caused in the passband, resulting in a problem in practice. The problem of reflected waves can be eliminated by forming the oval-shaped resonator portion 60 formed by the upper electrode and the lower electrode facing each other (see FIG. 5) or by forming the resonator portion 60 in an irregularly polygonal shape as shown in FIG. 7. Since an oval or an irregular polygon does not have two parallel lines, the requirement for horizontal resonance cannot be satisfied. Accordingly, horizontal standing waves cannot easily exist in the resonator portion 60.

In the above described embodiment, the parts of the piezoelectric film 30 located on the lower electrode 20 and the substrate 10 are removed, so as to prevent horizontal leakage through the piezoelectric film 30 deposited on the lower electrode 20 and the substrate 10.

Figure 8:
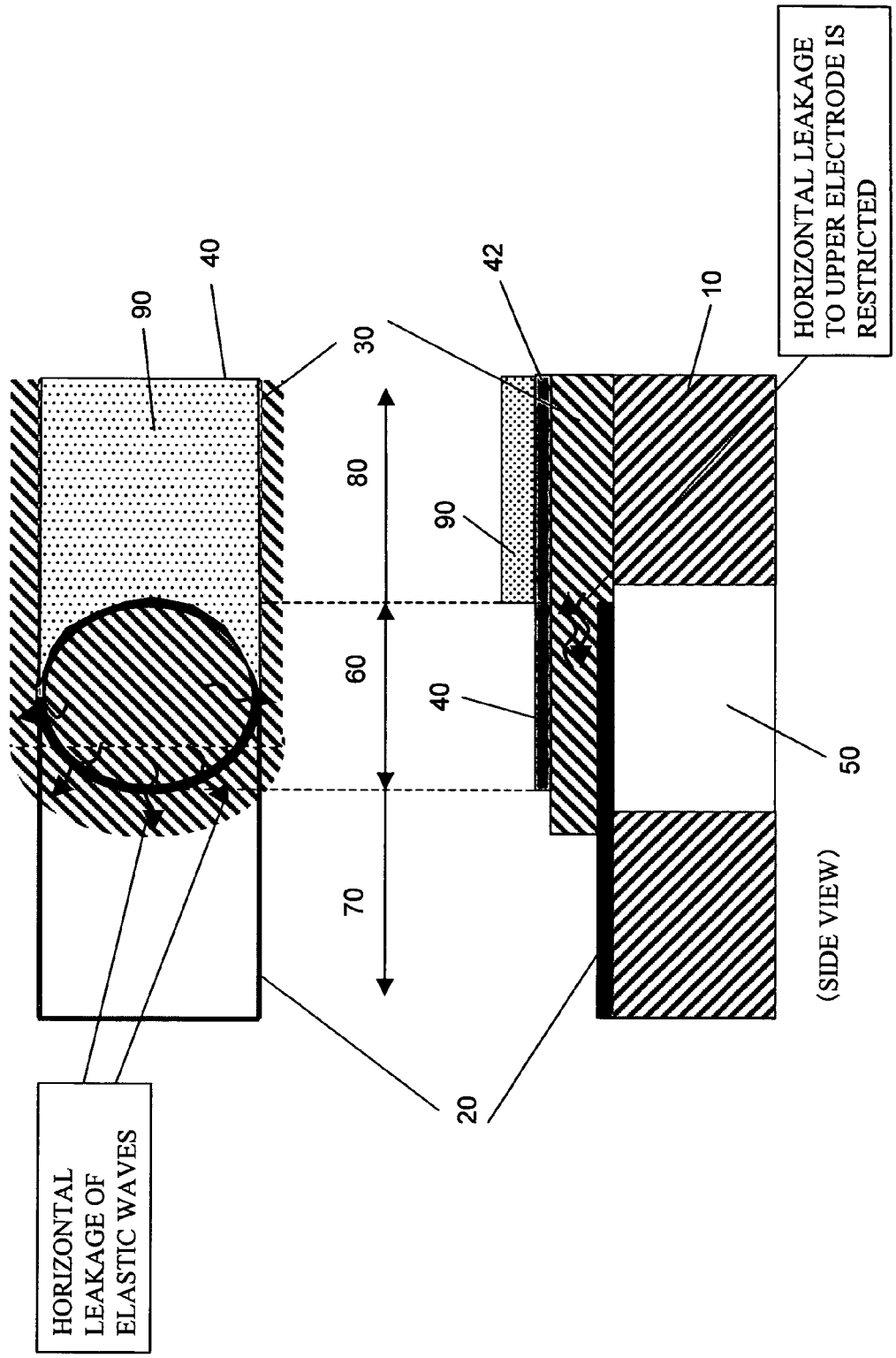
FIG. 8 illustrates another embodiment of the present invention.
Figure 9:
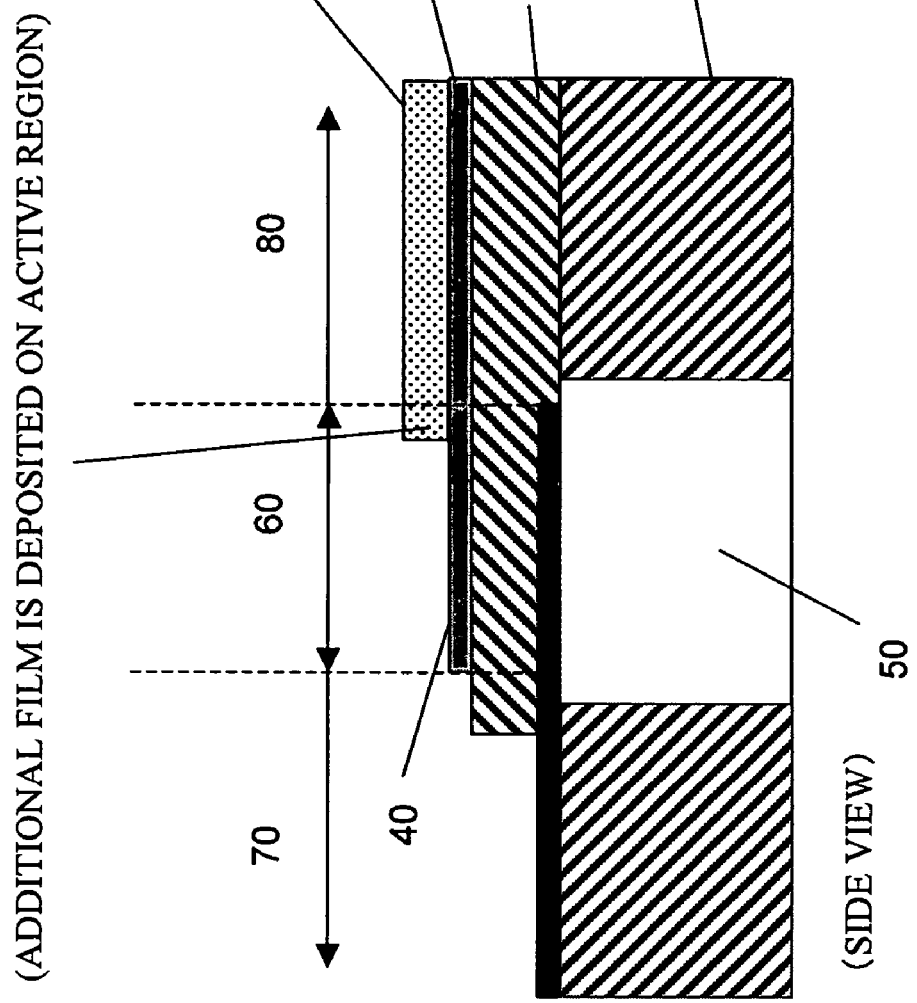
FIG. 9 illustrates a problem that might be caused in the embodiment illustrated in FIG. 8.
Figure 10:
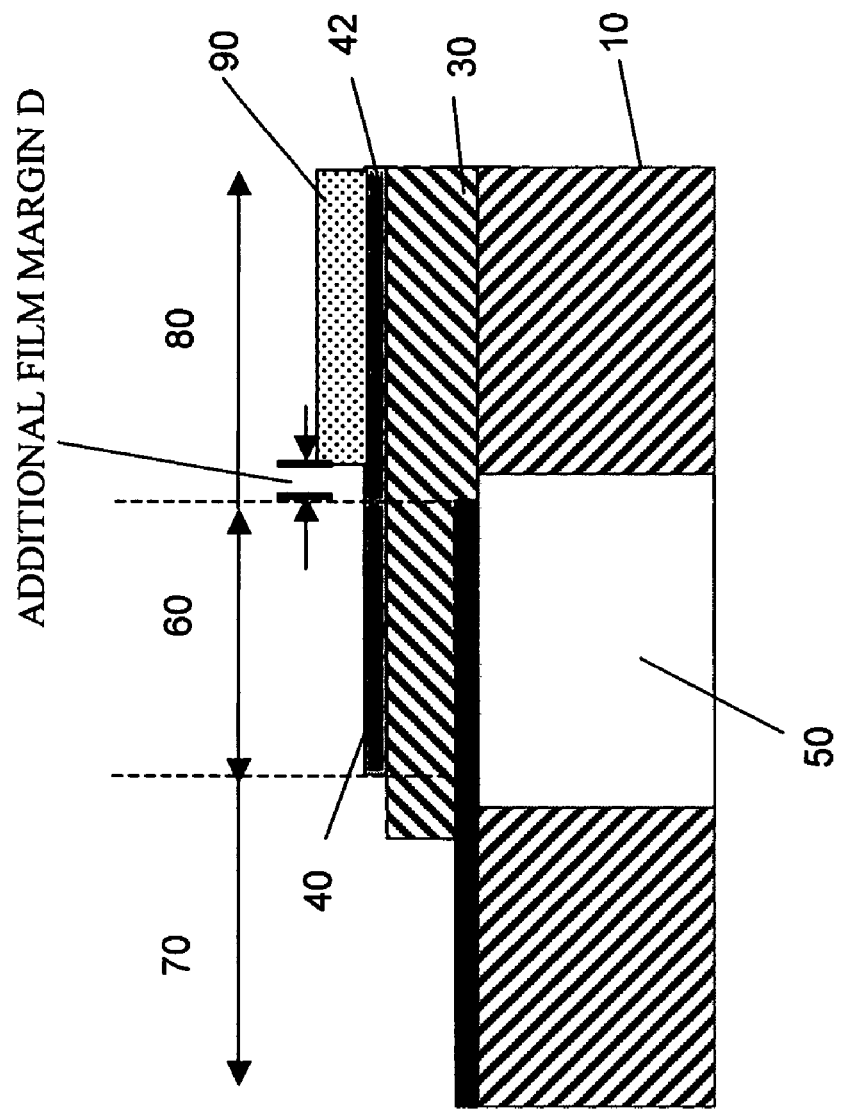
FIG. 10 shows the additional film margin of the embodiment illustrated in FIG. 8.

Next, a piezoelectric thin-film resonator that has a structure to prevent horizontal leakage to the extraction portion of the upper electrode is described. If the Poisson's ratio of the piezoelectric film is 1/3 or lower, the requirement for enclosing the elastic waves excited inside the resonator portion is that the sound velocity of the resonator portion should be higher than the sound velocity of the surrounding non-resonator portion(s). Therefore, an additional film 90 for reducing the sound velocity should be deposited in the vicinity of the resonator portion 60 on the extraction portion 42 of the upper electrode 40, as shown in FIG. 8. The horizontal leakage can be prevented in the piezoelectric thin-film resonator shown in FIG. 8 only when the Poisson's ratio of the piezoelectric film 30 is 1/3 or lower. A practical example of the material for the piezoelectric film 30 is AlN (aluminum nitride). The additional film 90 to be deposited on the extraction portion 42 of the upper electrode 40 should be a metal film to prevent horizontal leakage and to reduce the electric resistance of the extraction portion 42. In this manner, a more preferred structure can be realized. Furthermore, if the metal film to be deposited on the extraction portion 42 of the upper electrode 40 is a single-layer film or a multi-layer film containing Au as a main component, the metal film can also be used as a bump bonding film for flip-chip bonding. Thus, the production procedures are simplified, and a more preferred structure can be realized. Here, the additional film 90 to be deposited on the extraction portion 42 of the upper electrode 40 should preferably be in contact with the resonator portion 60, as shown in FIG. 8, so as to efficiently prevent the horizontal leakage. However, the additional film 90 might be deposited on the resonator portion 60 due to an error that is caused during the production procedure, as shown in FIG. 9. In such a case, the characteristics of the resonator deteriorate. To counter this problem, the additional film 90 is deposited, with a distance (an additional film margin) D being maintained between the resonator portion 60 and the additional film 90, as shown in FIG. 10. In an experiment carried out by the inventors, the horizontal leakage was prevented while the additional film margin D was around twice as long as the thickness of the resonator portion 60 (equivalent to the ½ wavelength of the elastic waves). Also, the shortest possible distance between the resonator portion 60 and the additional film 90 should be made 3 μm or shorter, in view of the errors caused by the manufacturing device. In this manner, the additional film 90 cannot be deposited on the resonator portion 60, and a piezoelectric thin-film resonator with low loss can be produced.

Two embodiments with the structures for preventing horizontal leakage have been described so far. If the two structures are combined, the effects of them are also combined to produce an even more preferred structure.

Further, the void 50 located below the resonator portion 60 should be designed to have a larger area than the area of the resonator portion 60. In this manner, the resonator 60 can freely vibrate, and a piezoelectric thin-film resonator with excellent characteristics can be obtained.

Also, in a case where a piezoelectric thin-film resonator filter is produced using at least one of the above described piezoelectric thin-film resonators, the loss can be reduced by the amount of reduction of the horizontal leakage. Thus, filter characteristics with lower loss can be achieved.

First Embodiment

This embodiment is an example of a piezoelectric thin-film resonator in which the substrate 10 is made of silicon, the lower electrode 20 and the upper electrode 40 are made of Ru (ruthenium), and the piezoelectric film 30 is made of AlN. The effects of the present invention were examined through this structure. The void 50 was formed by performing etching, such as deep RIE, on the bottom surface of the substrate 10. The shape of the resonator portion 60 formed by the upper electrode 40 and the lower electrode 20 facing each other is oval. The AlN piezoelectric film 30 is patterned to form the non-resonator portion 70 on the side of the lower electrode 20 as shown in FIG. 5, and approximately 50% of the patterned outer periphery of the piezoelectric film 30 overlaps the outer periphery of the resonator portion 60. The resonator portion 60 has an oval shape, and the patterning of the piezoelectric film 30 was performed by wet etching. For comparison, a piezoelectric thin-film resonator in which the outer periphery of the piezoelectric film 30 does not overlap the outer periphery of the resonator portion 60 as shown in FIG. 4 was produced, and the characteristics of the piezoelectric thin-film resonator were evaluated. Here, the valid electromechanical coupling coefficient of the piezoelectric thin-film resonator was 6.4% in the structure shown in FIG. 4, but it increased to 6.5% in the structure of the present invention shown in FIG. 5. The anti-resonance Q was approximately 500 in the structure shown in FIG. 4, but increased to approximately 600 in the structure illustrated in FIG. 5. According to these results, it was confirmed that the characteristics of the piezoelectric thin-film resonator of the present invention illustrated in FIG. 5 were better.

Second Embodiment

Figure 12:
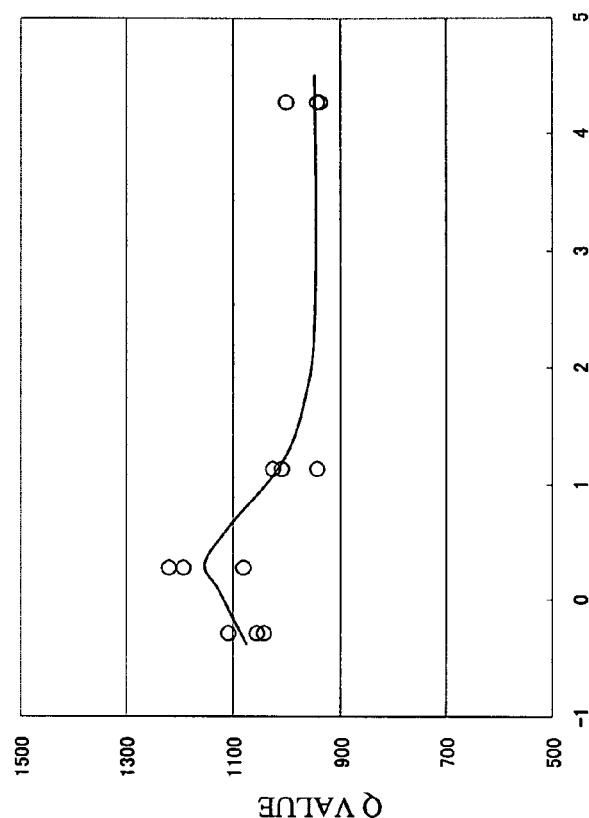
FIG. 12 is a graph showing the variation of the resonance value Q with respect to the additional film margin of the embodiment illustrated in FIG. 8.
Figure 11:
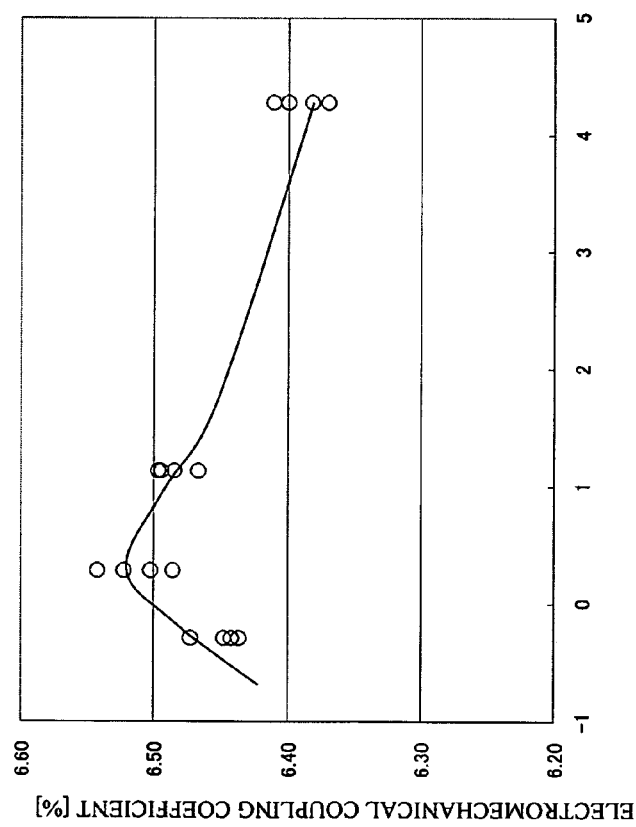
FIG. 11 is a graph showing the variation of the valid electromechanical coupling coefficient with respect to the additional film margin of the embodiment illustrated in FIG. 8.

This embodiment is a second example of a piezoelectric thin-film resonator in which the substrate 10 is made of silicon, the lower electrode 20 and the upper electrode 40 are made of Ru, and the piezoelectric film 30 is made of AlN. The effects of the present invention were examined through this structure. The void 50 was formed by performing etching, such as deep RIE, on the bottom surface of the substrate 10. The shape of the resonator portion 60 formed by the upper electrode 40 and the lower electrode 20 facing each other is oval. Here, the additional film 90 was produced on the extraction portion 42 of the upper electrode 40 as shown in FIG. 8. The additional film 90 was an Au film (300 nm) with a base film of Ti (100 nm in thickness). The Au/Ti additional film 90 is also formed on the pad portion for flip-chip bonding, and serves as the bonding layer when bumps are formed. Further, the characteristics were evaluated, with the margin D (the additional film margin) between the Au/Ti additional film 90 and the resonator portion 60 being varied. FIGS. 11 and 12 show variations of valid electromechanical coupling coefficients and variations of resonance values Q. In each of the graphs shown in FIGS. 11 and 12, the abscissa axis indicates the standardized value of the thickness of the resonator (the ½ wavelength of elastic waves), and negative values represent the cases where the additional film 90 covers the resonator portion 60 as shown in FIG. 9. According to the graphs, when the additional film margin D is substantially zero, the valid electromechanical coupling coefficient and the resonance value Q both become largest. If the additional film margin D becomes smaller than twice the elastic wave wavelength, the resonance value Q and the electromechanical coupling coefficient tend to improve. Accordingly, as long as the shortest distance between the additional film 90 and the outer periphery of the resonator portion 60 is smaller than twice the thickness of the resonator portion 90, the performance of the piezoelectric thin-film resonator can be improved.

Third Embodiment

Figure 13:
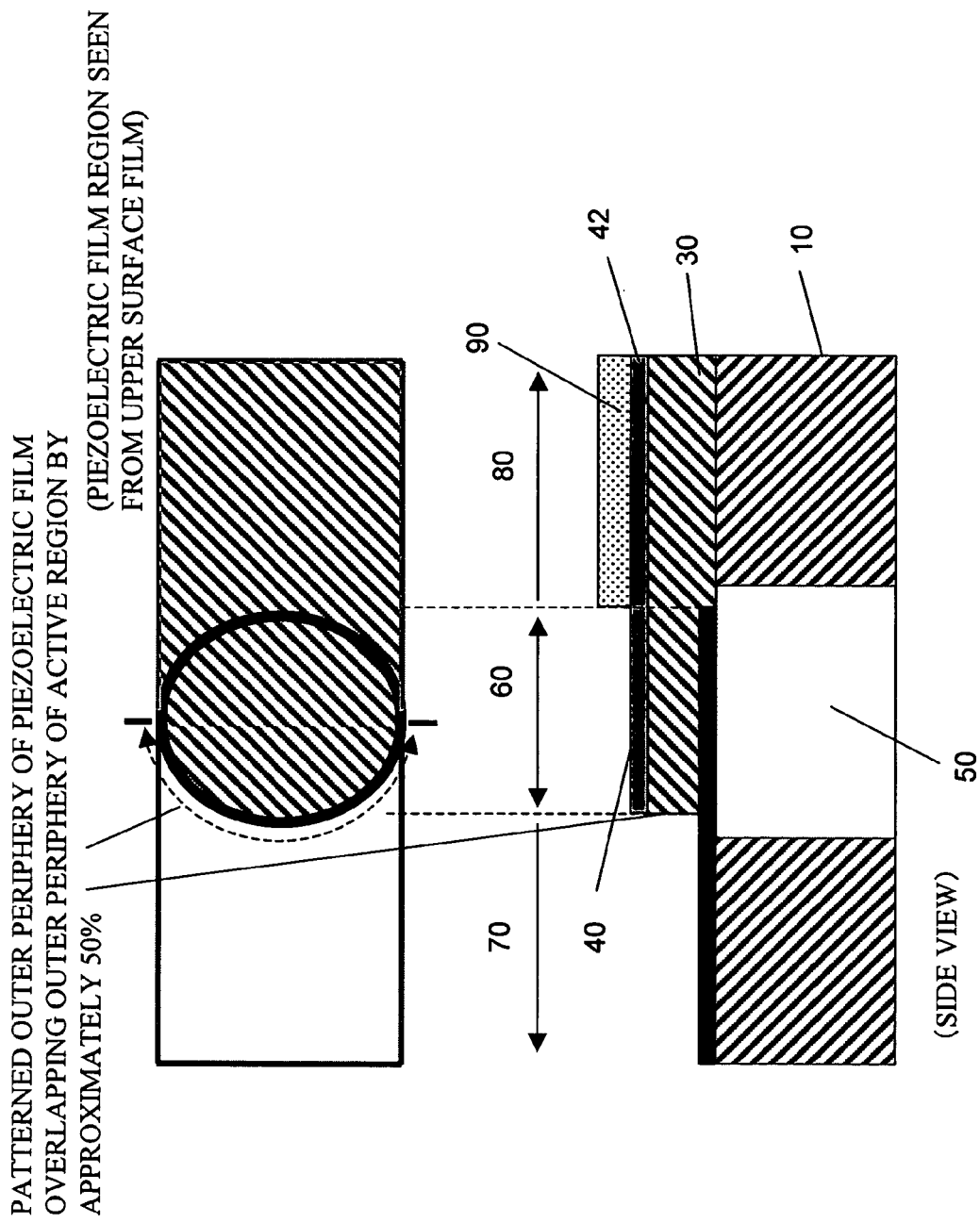
FIG. 13 illustrates a modification of the embodiment illustrated in FIG. 8.
Figure 14:
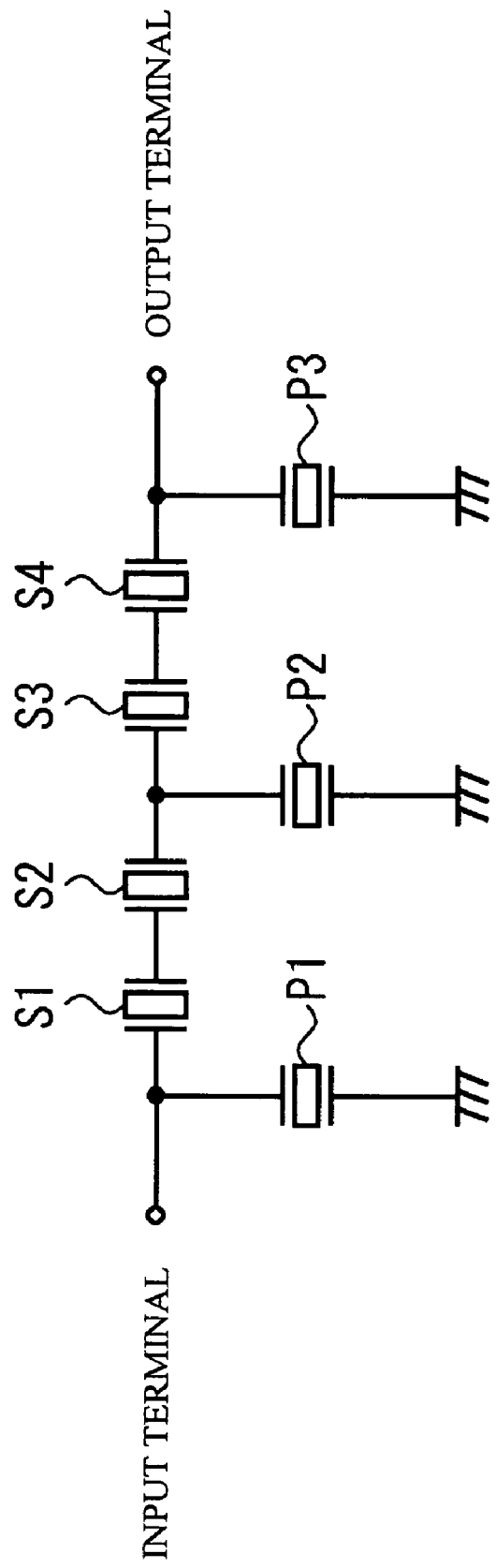
FIG. 14 illustrates an example structure of a ladder-type filter.
Figure 15:
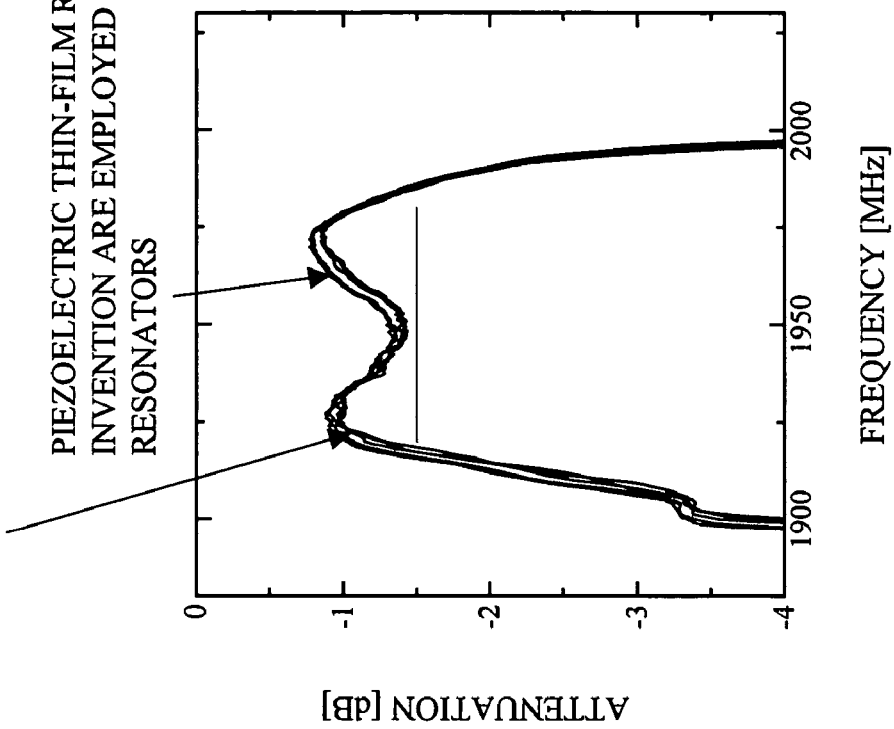
FIG. 15 is a graph showing the frequency characteristics of the ladder-type filter that is formed with piezoelectric thin-film resonators of the present invention.

FIG. 14 shows a ladder-type filter formed with piezoelectric thin-film resonators. Each of the piezoelectric thin-film resonators was produced by combining the embodiment having the outer periphery of the piezoelectric film 30 partially overlapping the outer periphery of the resonator portion 60 with the embodiment having the additional film 90 deposited on the extraction portion 42 of the upper electrode 40. The effects of the present invention were examined through this structure. The electrodes and the piezoelectric film material are the same as those of the above described two embodiments. The arrangement of the piezoelectric thin-film resonators is shown in FIG. 14. The ladder-type filter illustrated in FIG. 14 has a four-stage structure formed with series-arm resonators S1 through S4 and parallel-arm resonators P1 through P3. In this ladder-type filter, each two adjacent stages share one parallel-arm resonator. Also in this ladder-type filter, each of the parallel-arm resonators has the piezoelectric thin-film resonator structure of the present invention illustrated in FIG. 13. The bandpass characteristics of this ladder-type filter are shown in FIG. 15. For comparison, FIG. 15 also shows the characteristics of a filter in which each piezoelectric thin-film resonator has the structure illustrated in FIG. 1. As for the ladder-type filter that employs the piezoelectric thin-film resonators of the present invention as parallel-arm resonators, the insertion loss is improved by 0.1 dB over the entire passband, thereby confirming the effects of the present invention.

As described so far, in accordance with the present invention, a piezoelectric thin-film resonator with higher performance can be obtained. Accordingly, a filter or a duplexer that is formed with piezoelectric thin-film resonators of the present invention can have excellent characteristics with lower loss.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A piezoelectric thin-film resonator comprising:
a substrate;
a lower electrode that is formed on the substrate;
a piezoelectric film that is formed on the lower electrode and the substrate; and
an upper electrode that is formed on the piezoelectric film, with the piezoelectric film being partially interposed between the lower electrode and the upper electrode,
at least a part of an outer periphery of the piezoelectric film interposed between the lower electrode and the upper electrode overlapping substantially all of an outer periphery of a resonator portion formed by the upper electrode and the lower electrode facing each other across the piezoelectric film in a region from which the lower electrode extends outside the resonator portion, the at least part of the outer periphery of the piezoelectric film overlapping an outer periphery of the upper electrode, the lower electrode and the upper electrodes extending in opposite direction from the resonator portion, the lower electrode being exposed to a cavity below the resonator portion, wherein a portion, in which said at least part of the outer periphery of the piezoelectric film overlaps the outer periphery of the resonator portion and of the upper electrode, has an end that is located inside the cavity or that overlaps an end of the cavity, the piezoelectric film being exposed to air at the end of the portion, and the resonator portion being supported by the substrate via the lower electrode formed on the substrate in a region in which the lower electrode extends from the cavity and being supported by the substrate via the piezoelectric film formed on the substrate in a region in which the upper electrode extends from the cavity.

2. The piezoelectric thin-film resonator as claimed in claim 1, wherein 50% or more of the outer periphery of the piezoelectric film overlaps the outer periphery of the resonator portion.

3. The piezoelectric thin-film resonator as claimed in claim 1, wherein the resonator portion has an oval shape.

4. The piezoelectric thin-film resonator as claimed in claim 1, wherein:
the resonator portion has an irregularly polygonal shape; and
at least two sides of the polygon are not parallel to each other.

5. The piezoelectric thin-film resonator as claimed in claim 1, wherein the cavity is wider than the region.

6. The piezoelectric thin-film resonator as claimed in claim 1, wherein the outer periphery of the piezoelectric film has an edge formed by patterning.

7. The piezoelectric thin-film resonator as claimed in claim 1, wherein the resonator portion forms a resonator of thickness longitudinal vibration mode.

8. The piezoelectric thin-film resonator as claimed in claim 1, wherein the lower electrode is provided directly on the substrate.

9. The piezoelectric thin-film resonator as claimed in claim 1, further comprising an additional film that is formed on an extension portion of the upper electrode remote from the lower electrode, the additional film extending up to all of the vicinity of said resonator portion.

10. A filter comprising piezoelectric thin-film resonators including a piezoelectric thin-film resonator comprising:
a substrate;
a lower electrode that is formed on the substrate;
a piezoelectric film that is formed on the lower electrode and the substrate; and
an upper electrode that is formed on the piezoelectric film, with the piezoelectric film being partially interposed between the lower electrode and the upper electrode,
at least a part of an outer periphery of the piezoelectric film interposed between the lower electrode and the upper electrode overlapping substantially all of an outer periphery of a resonator portion formed by the upper electrode and the lower electrode facing each other across the piezoelectric film in a region from which the lower electrode extends outside the resonator portion, the at least part of the outer periphery of the piezoelectric film overlapping an outer periphery of the upper electrode, the lower electrode and the upper electrodes extending in opposing directions from the resonator portion, the lower electrode being exposed to a cavity below the resonator portion, wherein a portion, in which said at least part of the outer periphery of the piezoelectric film overlaps the outer periphery of the resonator portion and of the upper electrode, has an end that is located inside the cavity or that overlaps an end of the cavity, the piezoelectric film being exposed to air at the end of the portion, and the resonator portion being supported by the substrate via the lower electrode formed on the substrate in a region in which the lower electrode extends from the cavity and being supported by the substrate via the piezoelectric film formed on the substrate in a region in which the upper electrode extends from the cavity.

11. The filter as claimed in claim 10, further comprising an additional film that is formed on an extension portion of the upper electrode remote from the lower electrode, the additional film extending up to all of the vicinity of said resonator portion.

\* \* \* \* \*